(12) United States Patent
Ko

(10) Patent No.: US 10,123,282 B2
(45) Date of Patent: Nov. 6, 2018

(54) DISTRIBUTED ANTENNA SYSTEM INTERFACE TRAY

(71) Applicant: ADVANCED RF TECHNOLOGIES, INC., Burbank, CA (US)

(72) Inventor: Young-Hoon Ko, Icheon-si (KR)

(73) Assignee: ADVANCED RF TECHNOLOGIES, INC., Burbank, CA (US)

( * ) Notice: Subject to any disclaimer, the term of this patent is extended or adjusted under 35 U.S.C. 154(b) by 87 days.

(21) Appl. No.: 15/226,609

(22) Filed: Aug. 2, 2016

(65) Prior Publication Data

US 2017/0041125 A1    Feb. 9, 2017

(30) Foreign Application Priority Data

Aug. 3, 2015 (KR) .................. 10-2015-0109409

(51) Int. Cl.
| | |
|---|---|
| *H04B 7/005* | (2006.01) |
| *H04W 52/24* | (2009.01) |
| *H04W 52/52* | (2009.01) |
| *H04W 52/42* | (2009.01) |
| *H04B 7/024* | (2017.01) |
| *H04B 17/10* | (2015.01) |
| *H03G 3/30* | (2006.01) |
| *H04B 1/04* | (2006.01) |

(52) U.S. Cl.
CPC .......... *H04W 52/243* (2013.01); *H04B 7/024* (2013.01); *H04B 17/102* (2015.01); *H04W 52/42* (2013.01); *H04W 52/52* (2013.01); *H03G 3/3052* (2013.01); *H04B 1/0458* (2013.01)

(58) Field of Classification Search
None
See application file for complete search history.

(56) References Cited

U.S. PATENT DOCUMENTS

| | | | |
|---|---|---|---|
| 2013/0236180 A1 | 9/2013 | Kim et al. | |
| 2016/0056540 A1* | 2/2016 | Famili | H01Q 21/0025 455/562.1 |
| 2016/0098167 A1* | 4/2016 | Shah | G06F 3/0488 345/173 |

FOREIGN PATENT DOCUMENTS

| | | |
|---|---|---|
| JP | 2013-541875 A | 11/2013 |
| KR | 10-2012-0106868 | 9/2012 |
| KR | 10-1463239 B1 | 11/2014 |

(Continued)

*Primary Examiner* — Otis L Thompson, Jr.
(74) *Attorney, Agent, or Firm* — Lewis Roca Rothgerber Christie LLP

(57) ABSTRACT

A distributed antenna system interface tray (DIT) includes a plurality of per-carrier points of interface (POIs), a combiner, and a DIT management system (DMS). Each of the plurality of POIs may be configured to couple with a corresponding per-carrier base transceiver station (BTS), receive a per-carrier downlink (DL) signal from the corresponding BTS, filter the DL signal through a duplexer, adjust the filtered DL signal based on a designated level, output the filtered DL signal to a combiner, receive an uplink (UL) signal from the combiner, adjust the UL signal based on a designated gain, and transmit the UL signal to the corresponding BTS. The combiner may be configured to combine a plurality of DL signals received from the plurality of POIs into a combined DL signal, transmit the combined DL signal to a distributed antenna system, receive a UL signal from the distributed antenna system, and distribute the UL signal to the plurality of POIs.

20 Claims, 13 Drawing Sheets

(56) References Cited

FOREIGN PATENT DOCUMENTS

| KR | 10-2015-0047724 A | 5/2015 |
|---|---|---|
| WO | WO 2011/098861 A1 | 8/2011 |
| WO | WO 2012/024349 A1 | 2/2012 |

\* cited by examiner

DISTRIBUTED ANTENNA SYSTEM INTERFACE TRAY

CROSS-REFERENCE TO RELATED APPLICATION(S)

This application claims priority to and the benefit of Korean Patent Application No. 10-2015-0109409 filed on Aug. 3, 2015, in the Korean Intellectual Property Office, the entire content of which is incorporated herein by reference.

BACKGROUND

1. Field

One or more example embodiments relate to a device for a base station.

2. Description of Related Art

In an existing interface between a base transceiver station (BTS) and a distributed antenna system (DAS), the DAS may not be configured to receive an input signal of high-power level (for example, a downlink (DL) signal), which is, for example, tens of watts or higher, from the BTS. Thus, a high-power attenuator may be used to connect the DAS to the BTS. When the high-power attenuator attenuates the high-power level input from the BTS to the DAS to a level within the range that the DAS can handle, the BTS is connected with the DAS.

However, the scheme of attenuating the level of the high-power level signal from the BTS through the high-power attenuator deteriorates a call quality of the BTS since passive intermodulation (PIM) noise may affect or influence the signal carried in a BTS uplink (UL) band due to a poor PIM characteristic of the high-power attenuator.

The call quality is significant in high-speed data transmission. Thus, improved systems and methods for connecting a BTS to a DAS are needed.

SUMMARY

To solve the issues mentioned above, an aspect provides a distributed antenna system (DAS) interface tray (DIT) that may perform gain control and monitoring, and provide a multi-carrier service.

A DIT transfers a high-power downlink (DL) radio frequency (RF) signal of a base transceiver station (BTS) to a DAS and transfers an uplink (UL) signal output from the DAS to the BTS without passive intermodulation (PIM).

One or more example embodiments relate to a DIT that may interface a high-power signal of a BTS with a DAS.

According to an aspect, there is provided a DIT that is present for each band and each carrier, performs level monitoring for each carrier and gain control to an appropriate level with respect to downlink DL signals input from multiple BTSs, combines the multiple per-carrier signals into a single line, transmits a combined signal to a DAS, adjusts an UL signal input from the DAS to an appropriate level for each carrier, and transmits the UL signal to the per-carrier BTSs. The DIT may include a point of interface (POI) including a cavity duplexer (DUP) connected directly to an antenna port of a BTS and configured to separate a DL path and a UL path for each carrier with respect to multiple per-carrier signals; a fixed attenuator (F ATT) configured to reduce a level of a high-power DL signal input from the BTS by a designated amount to protect devices at a back end thereof; an input detector (IDET) provided on the DL path and configured to detect a level of the DL signal input from the BTS and transmit the detected level information to a POI controller (POIC); an output detector (ODET) provided on the DL path and configured to detect a level of a POI DL output signal and transmit the detected level information to the POIC; a DL variable attenuator (DL V ATT) provided on the DL path and configured to adjust a signal to an appropriate level; a UL variable attenuator (UL V ATT) provided on the UL path and configured to adjust a signal to an appropriate level; and a POI controller (POIC) configured to monitor and control a state of the POI and communicate with a DIT management system (DMS), a combiner configured to combine signals input from multiple per-carrier POIs and transmit a combined signal to the DAS in a DL direction, and to transmit a signal input from the DAS to each of the per-carrier POIs in a UL direction, a fan unit (FU) configured to cool down heat emitted from the DIT and control temperature of the entire system and internal devices of the DIT, and a DMS configured to monitor and control states of the per-carrier POIs, the COM, and the FU of the same DIT and to receive, monitor, and control one or more other DITs connected in a form of daisy chain or star.

A distributed antenna system interface tray (DIT) includes a plurality of per-carrier points of interface (POIs), a combiner, and a DIT management system (DMS). Each of the plurality of POIs may be configured to couple with a corresponding per-carrier base transceiver station (BTS), receive a per-carrier downlink (DL) signal from the corresponding BTS, filter the DL signal through a duplexer, adjust the filtered DL signal based on a designated level, output the filtered DL signal to a combiner, receive an uplink (UL) signal from the combiner, adjust the UL signal based on a designated gain, and transmit the UL signal to the corresponding BTS. The combiner may be configured to combine a plurality of DL signals received from the plurality of POIs into a combined DL signal, transmit the combined DL signal to a distributed antenna system, receive a UL signal from the distributed antenna system, and distribute the UL signal to the plurality of POIs. The DIT management system (DMS) may be configured to monitor and control the plurality of POIs and the combiner.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects and features of the disclosure will become apparent and more readily appreciated from the following description of example embodiments, taken in conjunction with the accompanying drawings of which.

DETAILED DESCRIPTION

Figure 1:
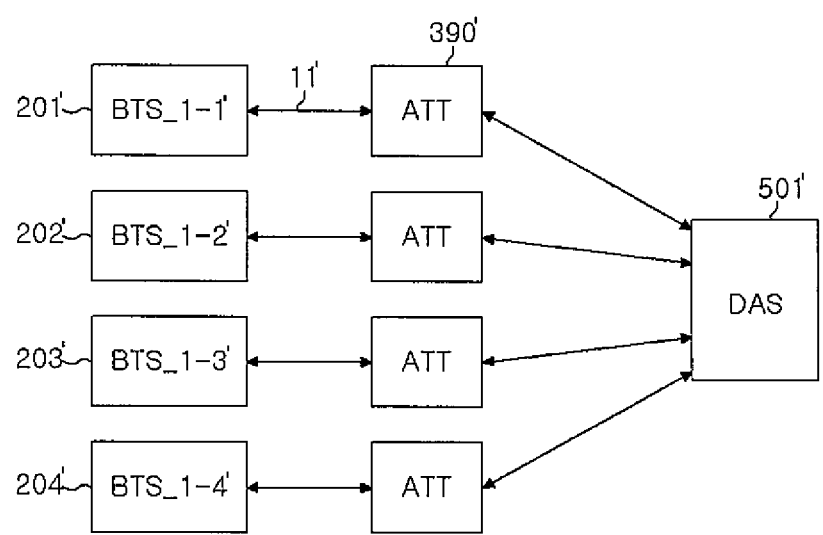
FIG. 1 is a diagram illustrating connection between base transceiver stations (BTSs) and a distributed antenna system (DAS) through a number of attenuators (ATT) corresponding to a number of carriers to support a single band and four carriers according to related art.

FIG. 1 illustrates connections between base transceiver stations (BTSs) BTS _1-1' 201', BTS_1-2' 202', BTS_1-3' 203', and BTS_1-4' 204' (hereinafter "BTSs 201', 202', 203', and 204'") and a distributed antenna system (DAS) 501' through attenuators (ATTs) 390'. The ATTs 390' has a poor passive intermodulation (PIM) characteristic with respect to a high-power signal, and thus affects a quality of service of the BTSs 201', 202', 203', and 204'.

Figure 2:
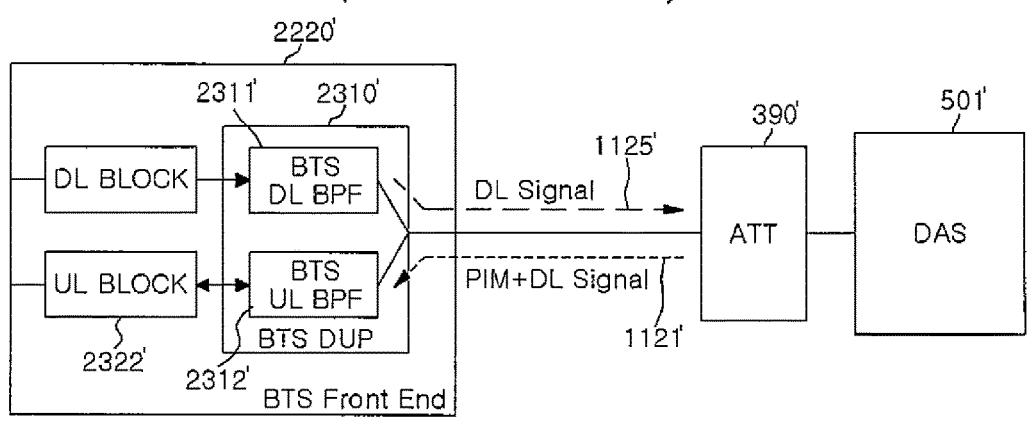
FIG. 2 is a diagram illustrating a configuration and signal flows in connection between a BTS and a DAS according to related art.

FIG. 2 is a diagram illustrating in detail the connections between the BTSs 201', 202', 203', and 204' and the DAS 501' through the ATTs 390'. For ease of description, only a BTS front end (BTS FE) 2220' among the BTSs 201', 202', 203', and 204' is illustrated. In addition, signal flows with respect to occurrence of PIM are also illustrated.

Figure 3:
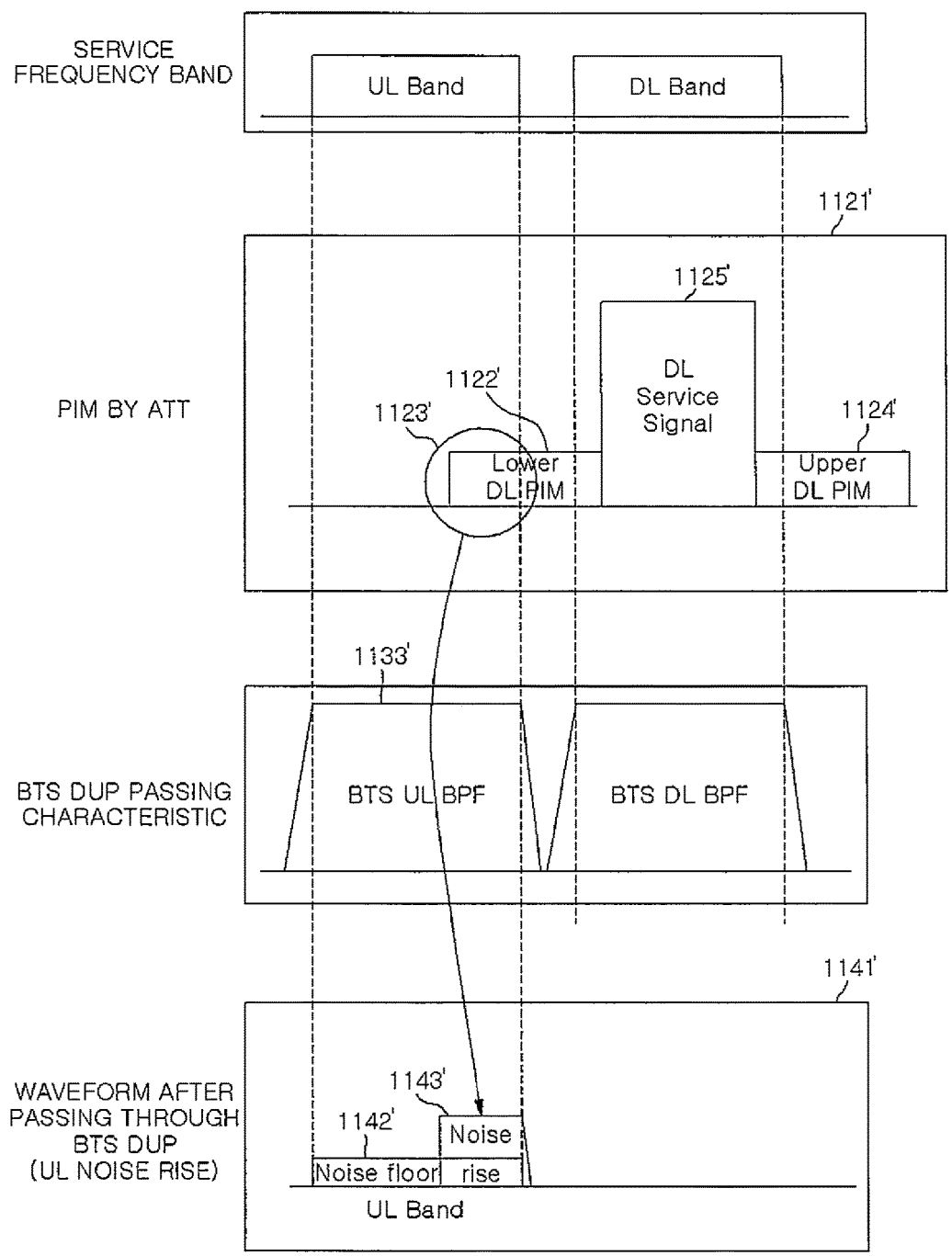
FIG. 3 is a diagram illustrating a change in waveform with respect to signal flows in connection between a BTS and a DAS according to related art.

FIG. 3 is a diagram illustrating the signal flows of FIG. 2, a change in waveform in a frequency band, and a characteristic of a BTS duplexer (DUP) 2310'.

A downlink (DL) signal 1125' is output from the BTS FE 2220' in the BTS 201', 202', 203' or 204' of FIG. 2. When the DL signal 1125' is input into an ATT 390', the ATT 390' is supposed to attenuate the DL signal 1125' based on a designated amount of attenuation, and transmit the attenuated DL signal to the DAS 501'. However, the ATT 390' transmits a signal 1121' in which the DL signal 1125' is mixed with PIM signals 1122' and 1124' generated by the DL signal 1125' in a direction of the BTS 201', 202', 203', or 204'.

The signal 1121' transmitted to the BTS 201', 202', 203', or 204' is filtered 1133' through a BTS uplink band-pass filter (UL BPF) 2312' of the BTS DUP 2310' of the BTS FE 2220', and transmitted to a UL block 2322'. In this example, a waveform 1141' after passing through the BTS DUP 2310' includes a UL noise floor 1142' input from the DAS 501', and a residual signal 1123' after the mixed signal 1121' is filtered by the BTS UL BPF 1133'. In particular, a noise rise 1143' exceeding the UL noise floor 1142' deteriorates a BTS UL receiving sensitivity, and thus has a serious effect on a quality of service.

Hereinafter, example embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described.

According to example embodiments, the following effects may be achieved.

First, a high-power, for example, tens of watts or greater, BTS signal may be connected to a DAS without influence of passive intermodulation (PIM).

Second, multiple per-carrier high-power BTS signals input into a DAS may be optimized for each carrier, and efficiency of initial installation and operation may increase.

Figure 4:
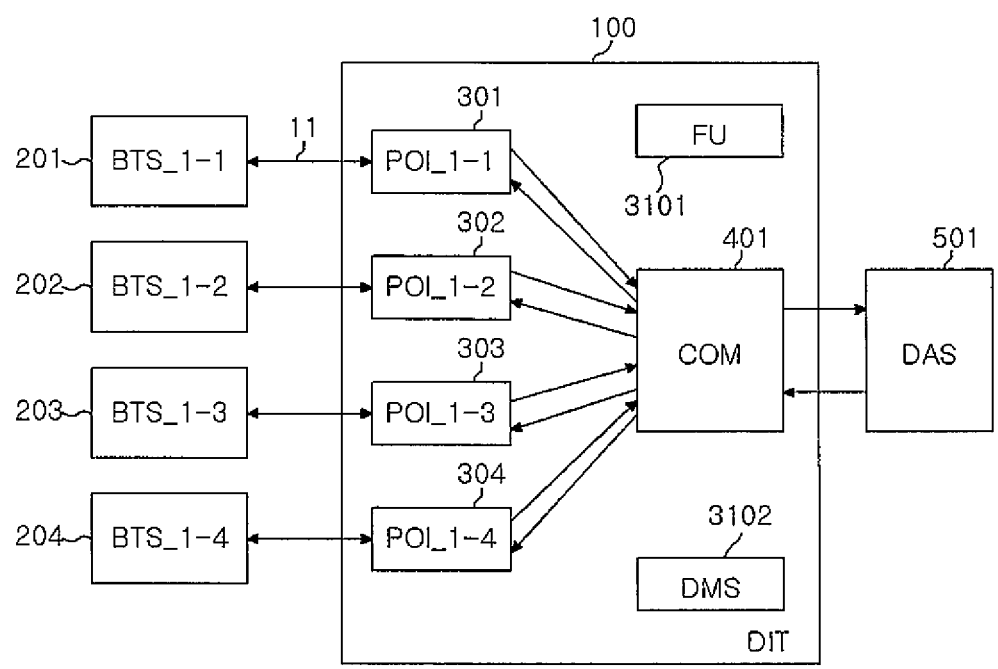
FIG. 4 is a diagram illustrating connection between multi-carrier BTSs and a DAS through a DAS interface tray (DIT) to support a single band and four carriers according to an example embodiment.

FIG. 4 illustrates a configuration of a DAS interface tray (DIT) 100 including points of interface (POIs) POI_1-1 301, POI_1-2 302, POI_1-3 303, and POI_1-4 304 (hereinafter "POIs 301, 302, 303, and 304") connected to per-carrier BTSs BTS_1-1 201, BTS_1-2 202, BTS_1-3 203, and BTS_1-4 204 (hereinafter "BTSs 201, 202, 203, and 204") through radio frequency (RF) lines 11 to support four carriers.

Referring to FIG. 4, the DIT 100 is disposed between the BTSs 201, 202, 203, and 204 for multiple carriers and the DAS 501 to enable the DAS 501 to service multiple carriers.

As shown in FIG. 4, the DIT 100 includes the multiple per-carrier POIs 301, 302, 303, and 304 connected to the multiple per-carrier BTSs 201, 202, 203, and 204 through the RF lines 11. The per-carrier POIs 301, 302, 303, and 304 connected to the per-carrier BTSs 201, 202, 203, and 204 adjust high-power signals from the BTSs 201, 202, 203, and 204 based on a reduced and an appropriate gain or output, and transmit the signals to a combiner (COM) 401 having multiple per-carrier ports. The DIT 100 further includes the COM 401 configured to combine the input per-carrier signals into a single line and transmit a combined signal to the DAS 501, a fan unit (FU) 3101 configured to control a temperature of the DIT 100, and a DIT management system (DMS) 3102 configured to verify and monitor connection and configuration information of the DIT 100, and the POIs 301, 302, 303, and 304, the COM 401, and the FU 3101 provided in the DIT 100. In some embodiments, a fan unit may not be used, and other cooling systems may be applied.

Figure 5:
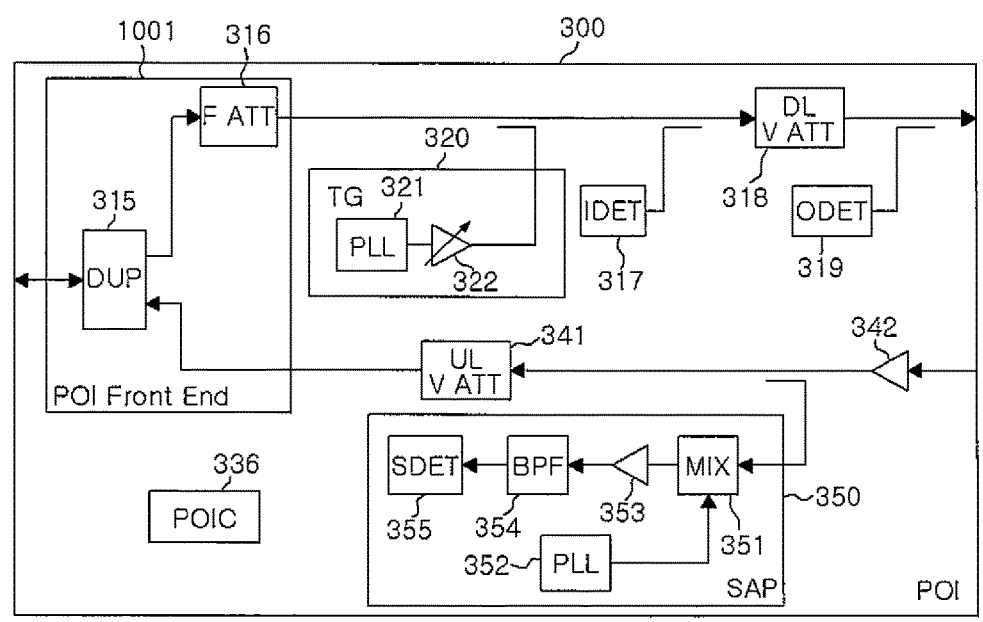
FIG. 5 is a diagram illustrating a configuration of a point of interface (POI) according to an example embodiment.

Referring to FIG. 5, a POI 300, which may be one of POIs 301, 302, 303 and 304, includes a cavity duplexer (DUP) 315 configured to be connected to a service antenna port of one of the multiple per-carrier BTSs 201, 202, 203, or 204 in the same band and configured to separate a DL path and a UL path; a fixed attenuator (F ATT) 316 configured to attenuate a high-power DL signal input from the BTS 201, 202, 203, or 204 to an appropriate level to prevent damage to devices at a back end of the POI 300; an input detector (IDET) 317 configured to detect a level of the DL signal input from the BTS 201, 202, 203, or 204 and transmit the detected level information to a POI controller (POIC) 336; an output detector (ODET) 319 configured to detect a level of the DL signal output to the DAS 501 and transmit the detected level information to the POIC 336; a tone generator (TG) 320 provided on the DL path, to be used to verify a state and set a DL gain of the per-carrier POI 300, and configured to function as a continuous wave (CW) tone signal generator; a DL variable attenuator (DL V ATT) 318 provided in the DL path and configured to adjust an RF signal to an appropriate level; a UL variable attenuator (UL V ATT) 341 provided in the UL path and configured to adjust an RF signal to an appropriate level; an amplification part (amplifier part) (e.g. an amplifier) 342 provided in the UL path and configured to amplify a level of a UL signal input into the per-carrier POI 300; and a spectrum analyzing part (SAP) 350 provided on the UL path and configured to monitor a spectrum waveform of the UL signal input into the per-carrier POI 300.

Figure 6:
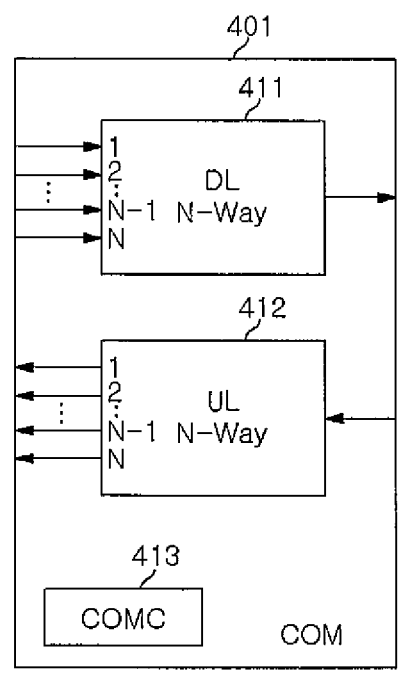
FIG. 6 is a diagram illustrating a configuration of a combiner (COM) according to an example embodiment.

Referring to FIG. 6, the COM 401 is connected to the per-carrier POIs 301, 302, 303, and 304 and is configured to combine multiple per-carrier signals into a single path in a case of DL and to distribute the UP signal to the per-carrier POIs 301, 302, 303, and 304 corresponding to the number of carriers in a case of UL. The COM 401 includes a DL N-way combiner (DL N-Way) 411 configured to combine signals input through n input ports into a single line and to transmit a combined signal to the DAS 501 in a DL direction, a UL N-way divider (UL N-Way) 412 configured to divide a signal input from the DAS 501 into multiple lines through n output ports and to transmit divided signals to the POIs 301, 302, 303, and 304 in a UL direction, and a combiner controller (COMC) 413 configured to pair and verify mutual connection information for each port of the COM 401 with the multiple per-carrier POIs 301, 302, 303, and 304, and to collect and monitor level information of signals of the POIs 301, 302, 303, and 304 connected to the respective ports.

An analog attenuator and a digital attenuator are used for the DL variable attenuator 318 and the UL variable attenuator 341. As those skilled in the art would appreciate, embodiments according to the present invention include suitable analog and or digital attenuators. As the DL variable attenuator 318 and the UL variable attenuator 341.

The TG 320 includes a phase locked loop (PLL) 321 and a variable gain amplifier 322 to enable a user to set an output, a frequency, and a tone holding time through a graphical user interface (GUI).

The COMC 413 has a commissioning function, and may cause the COM 401 output a signal at a per-carrier ratio desired by the user by performing automatic gain setting with respect to signals of different levels input from the per-carrier BTSs 201, 202, 203, and 204. The commissioning function is a function to output a signal of a level at the per-carrier ratio determined by the user by adjusting gains of the per-carrier POIs 301, 302, 303, and 304 to a calculated gain value based on the per-carrier percentage ratios determined by the user irrespective of input levels although levels of signals input from the per-carrier BTSs 201, 202, 203, and 204 into the per-carrier POIs 301, 302, 303, and 304 are different. Although an input level of a signal of a carrier is greater than a level set by a commissioning operation, by preventing a variation in a power ratio assigned to another carrier through automatic gain control for the input level of the signal not to exceed the set ratio, the commissioning function may maintain a per-carrier power ratio output from the COM 401 to be constant, whereby the DAS 501 may maintain a stable per-carrier quality of service. For example, in one or more embodiments, the COMC 413 controls the gain at each POI such that the signal output from the COM 401 has a particular power ratio assigned to each carrier.

Figure 9:
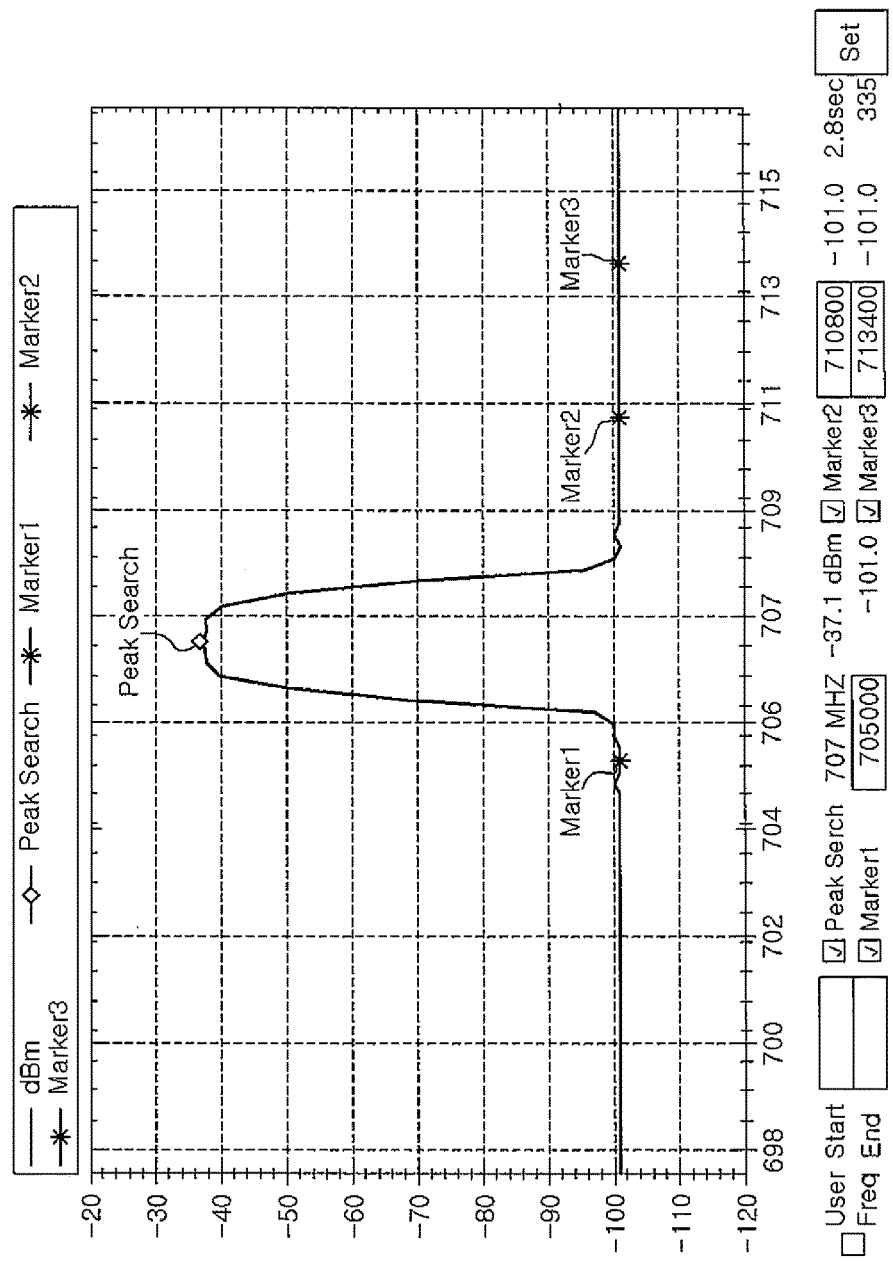
FIG. 9 is a graph illustrating a function of a spectrum analyzer of a spectrum analyzing part (SAP) of a graphical user interface (GUI) according to an example embodiment.

Further, the SAP 350 inputs the UL signal to a frequency mixer (MIX) 351 after coupling, converts the UL signal into an intermediate frequency (IF) signal through frequency conversion by a designated sweep of the PLL 352, filters the IF signal through a BPF 354 having a designated bandwidth, and detects a level of the filtered signal at a spectrum detector (SDET) 355. When the user inputs a desired frequency range of spectrum through the GUI, a value detected by the SDET 355 changes as a frequency of the PLL 352 is swept through a designated process. The changed value may be verified on a screen of the GUI using values and a graph with a frequency axis and a level axis, as shown in FIG. 9.

Figure 12:
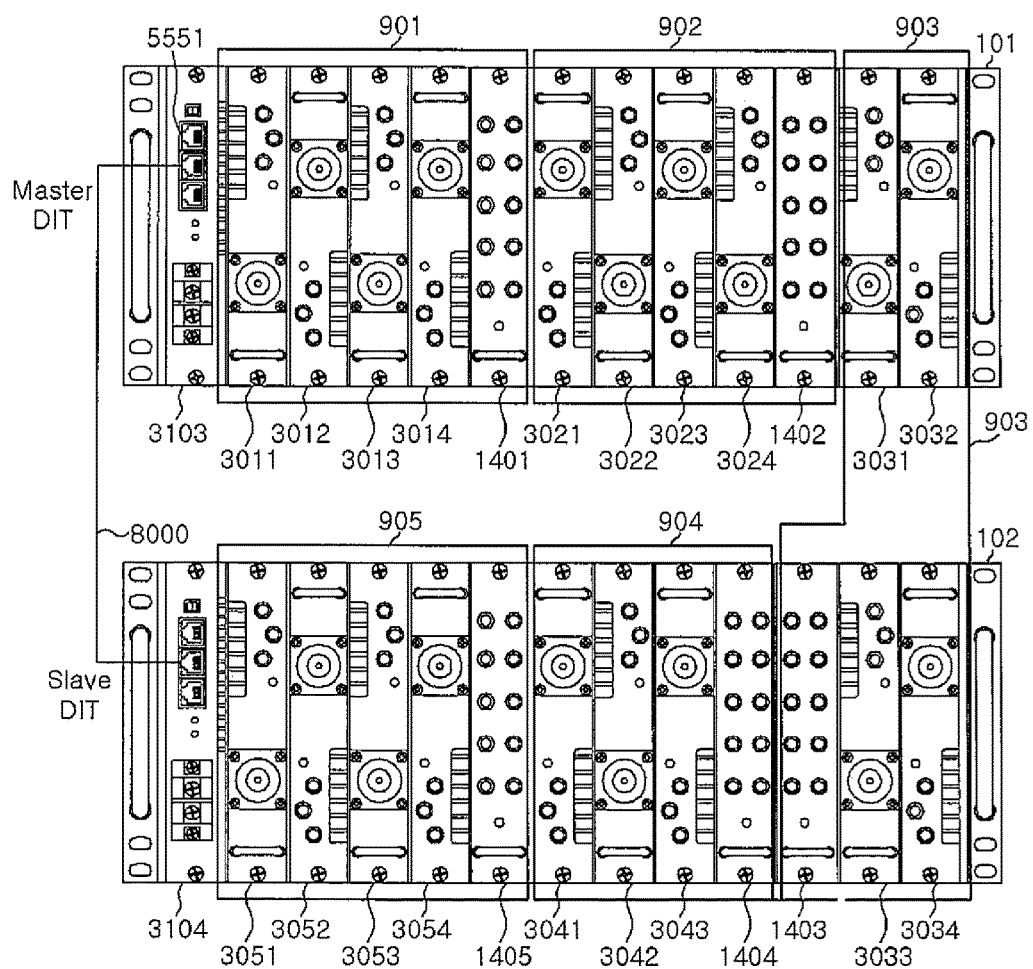
FIG. 12 is a diagram illustrating connection with another DIT being physically spaced according to an example embodiment.

As shown in FIG. 12, DITs 101 and 102 are mutually connected through an Ethernet line 8000. DIT 101 includes DMS 3103; POIs 3011, 3012, 3013, 3014, 3021, 3022, 3023, 3024, 3031, and 3032; and COMs 1401 and 1402. DIT 102 includes DMS 3104; POIs 3051, 3052, 3053, 3054, 3041, 3042, 3043, 3033, and 3034; and COMs 1403, 1404, and 1405. DITs 101 and 102 also include configurations 901, 902, 903, 904, and 905.

The DMSs 3103 and 3104 may designate one of the DITs 101 and 202, for example, the DIT 101, as a master DIT through a mutual connection scheme by a designated port connection position of a front Ethernet port 5551, or software settings or electrical switch settings of a DMS 3103 of the DIT 101. When the master DIT 101 is designated, the other of the DITs 101 and 102, for example, the DIT 102, may be a slave DIT.

The DMS 3103 of the master DIT 101 may manage the multiple DITs 101 and 102 logically as a single DIT system through communication with a DMS 3104 of the slave DIT 102. Through the foregoing, the COM 1401 may perform commissioning with respect to per-carrier POIs 3011, 3012, 3013, and 3014 provided in the same DIT 101 as shown in a configuration 901 of FIG. 12. The COM 1401 may also perform commissioning similar to commissioning with respect to POIs provided in a single DIT system, through communication between the DMS 3103 provided in the master DIT 101 and the DMS 3104 provided in the slave DIT 102 which manages a COM 1403 provided in the slave DIT 102 although the COM 1403 and POIs 3033 and 3034 are provided in the slave DIT 102 physically spaced from the master DIT 101 and remaining POIs 3031 and 3032 are provided in the master DIT 101. For example, the COM 1401 may perform commissioning for POIs 3031, 3032, 3033, and 3034 (where POIs 3031 and 3032 are included in DIT 101 and POIs 3033 and 3034 are included in DIT 102) by controlling COM 1403 through communication between DMS 3103 and DMS 3104.

For example, through a master/slave relationship, commissioning can be performed across multiple DITs; commissioning can be performed by a master COM in communication with a master DMS in a master DIT, where the master COM is in communication with a slave DMS in a slave DIT, thereby allowing the master COM to perform commissioning using the slave COM.

The DMS 3102 includes a power supply unit (PSU) to supply power to the DIT 100. The DMS 3102 manages the system of the DIT 100.

The DMS 3102 may be connected to through a separate Ethernet or a web GUI in a remote area where a user is unable to directly connect to the GUI in the site of the DIT 100, thereby verifying and controlling the state of the DIT 100 and downloading firmware.

Although FIG. 4 illustrates multiple carriers in a single band, the example may also be applied to a different number of bands.

Figure 10:
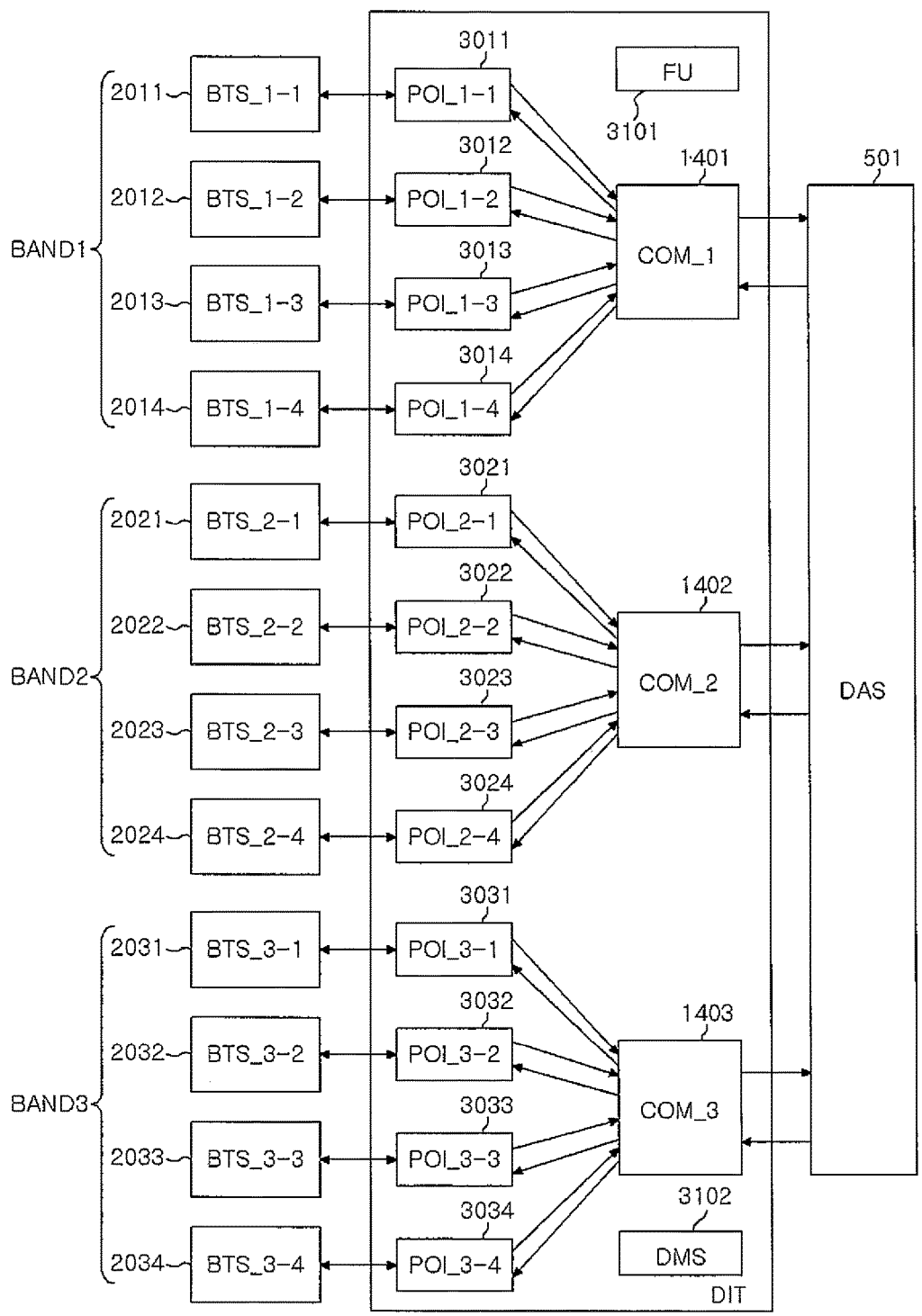
FIG. 10 is a diagram illustrating a configuration of a DIT to support three bands and four carriers according to an example embodiment.

FIG. 10 illustrates an example of a DIT including three bands and four carriers. Band 1 includes BTS_1-1 2011, BTS_1-2 2012, BTS_1-3 2013, and BTS_1-4 2014, connected to POI_1-1 3011, POI_1-2 3012, POI_1-3 3013, and POI_1-4 3014, respectively. POI_1-1 3011, POI_1-2 3012, POI_1-3 3013, and POI_1-4 3014 are connected to COM_1 1401. Band 2 includes BTS_2-1 2021, BTS_2-2 2022, BTS_2-3 2023, and BTS_2-4 2024, connected to POI_2-1

3021, POI_2-2 3022, POI_2-3 3023, and POI_2-4 3024, respectively. POI_2-1 3021, POI_2-2 3022, POI_2-3 3023, and POI_2-4 3024 are connected to COM_2 1402. Band 3 includes BTS_3-1 2031, BTS_3-2 2032, BTS_3-3 2033, and BTS_3-4 2034, connected to POI_3-1 3031, POI_3-2 3032, POI_3-3 3033, and POI_3-4 3034, respectively. POI_3-1 3031, POI_3-2 3032, POI_3-3 3033, and POI_3-4 3034 are connected to COM_3 1403.

Figure 7:
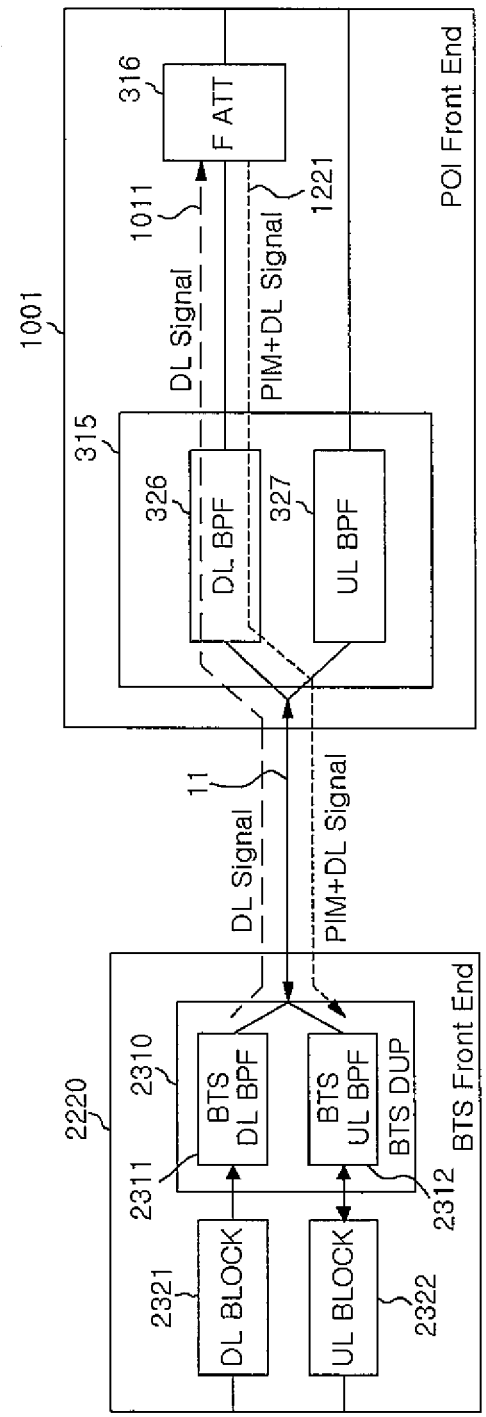
FIG. 7 is a diagram illustrating a configuration and signal flows in connection between a BTS and a DIT.
Figure 8:
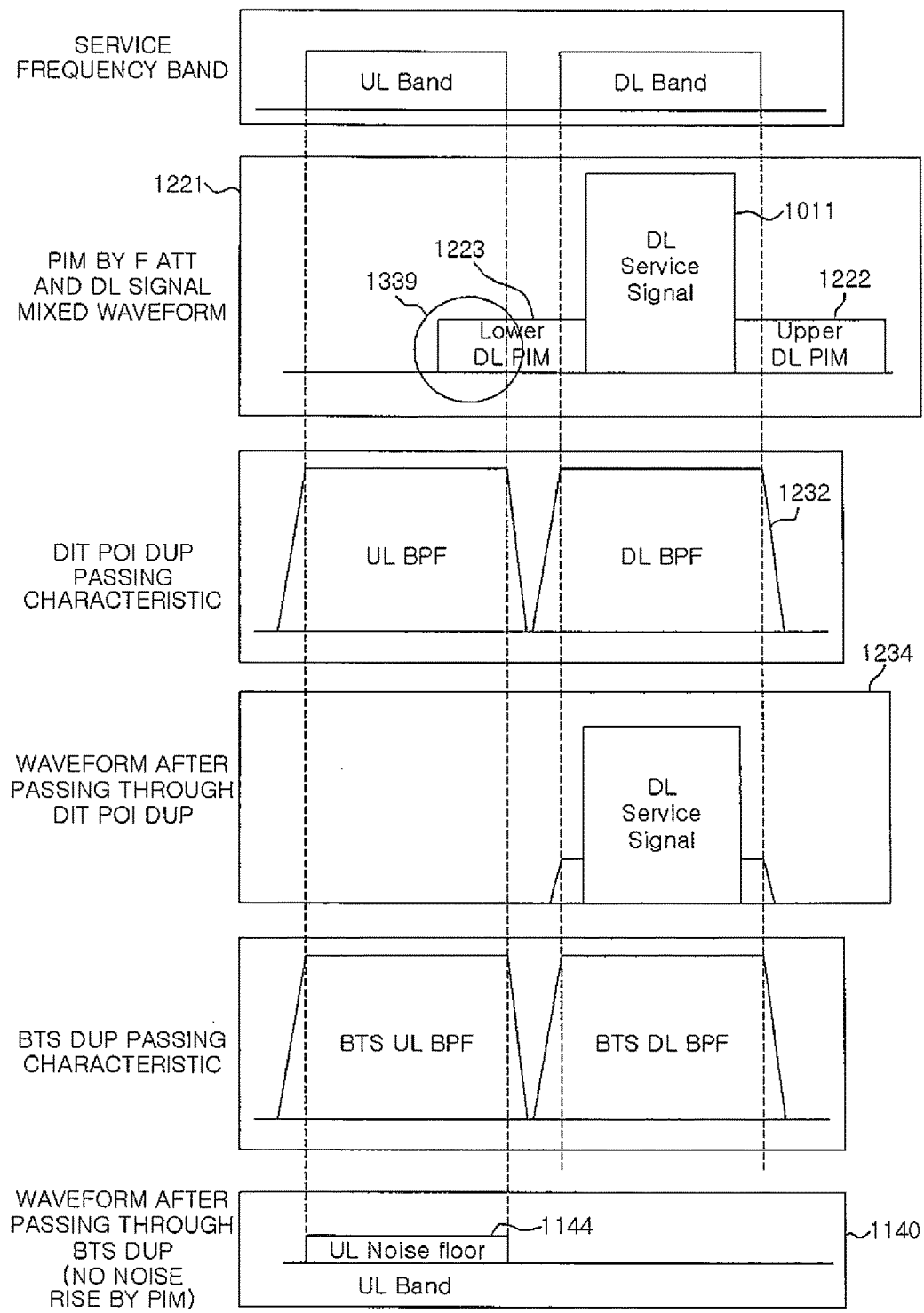
FIG. 8 is a diagram illustrating a change in waveform with respect to signal flows in connection between a BTS and a DIT.

FIG. 7 illustrates a connection and signal flows between a BTS and a DIT. FIG. 8 illustrates signal flows frequency pass characteristics of a POI DUP 315 and a BTS DUP 2310 and a change in waveform related to PIM.

Referring to FIG. 7, a DL signal 1011 output from a BTS FE 2220 in the BTS 201, 202, 203, or 204 passes through the POI DUP 315 and is input into the F ATT 316. The F ATT 316 is configured to attenuate the input signal based on a designated amount of attenuation, and transmit the signal to a back end of the POI 301, 302, 303, or 304. However, the F ATT 316 transmits, to the POI DL BPF 326 in the POI DUP 315, a signal 1221 in which the DL signal 1011 is mixed with PIM signals 1222 and 1223 generated by a high-power signal in a direction of the BTS 201, 202, 203, or 204 which is an opposite direction.

The signal 1221 transmitted to the POI DL BPF 326 is filtered 1232 and passes through the POI DUP 315 to have a waveform 1234, for example a waveform in which a signal band waveform 1339 corresponding to a UL band has been filtered out. The signal with the waveform 1234 passes through the BTS UL BPF 2312 of the BTS DUP 2310 and is transmitted to a UL block 2322. In this example, the waveform 1140 transmitted to the UL block 2322 does not include a noise rise resulting from PIM, but includes a component of a UL noise floor 1144 transmitted from the DAS 501 and input through the DIT 100, and thus does not have an effect on a BTS UL sensitivity and a quality of service.

The POI DUP 315 may have an excellent high-power PIM characteristic so that the PIM characteristic may not affect a call quality.

Figure 11:
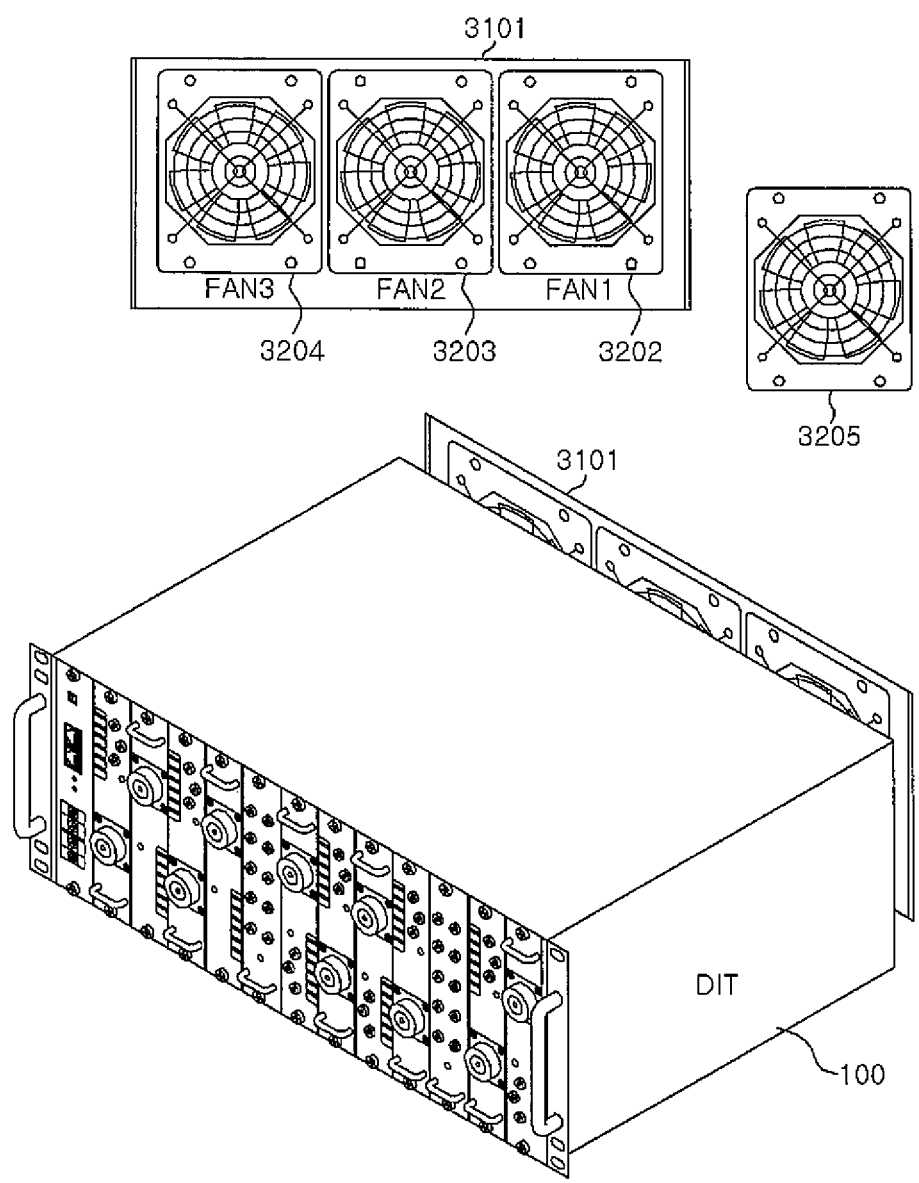
FIG. 11 is a diagram illustrating a configuration and installation of a fan unit (FU) according to an example embodiment.

As shown in FIG. 11, the FU 3101 may be attached to a rear side of the DIT 100 to control a temperature of the DIT 100. The FU 3101 includes a plurality of FAN modules 3202, 3203, and 3204. When one of the FAN modules 3202, 3203, and 3204 is out of order, it may be easily detached and replaced with a new FAN module 3205.

Figure 13:
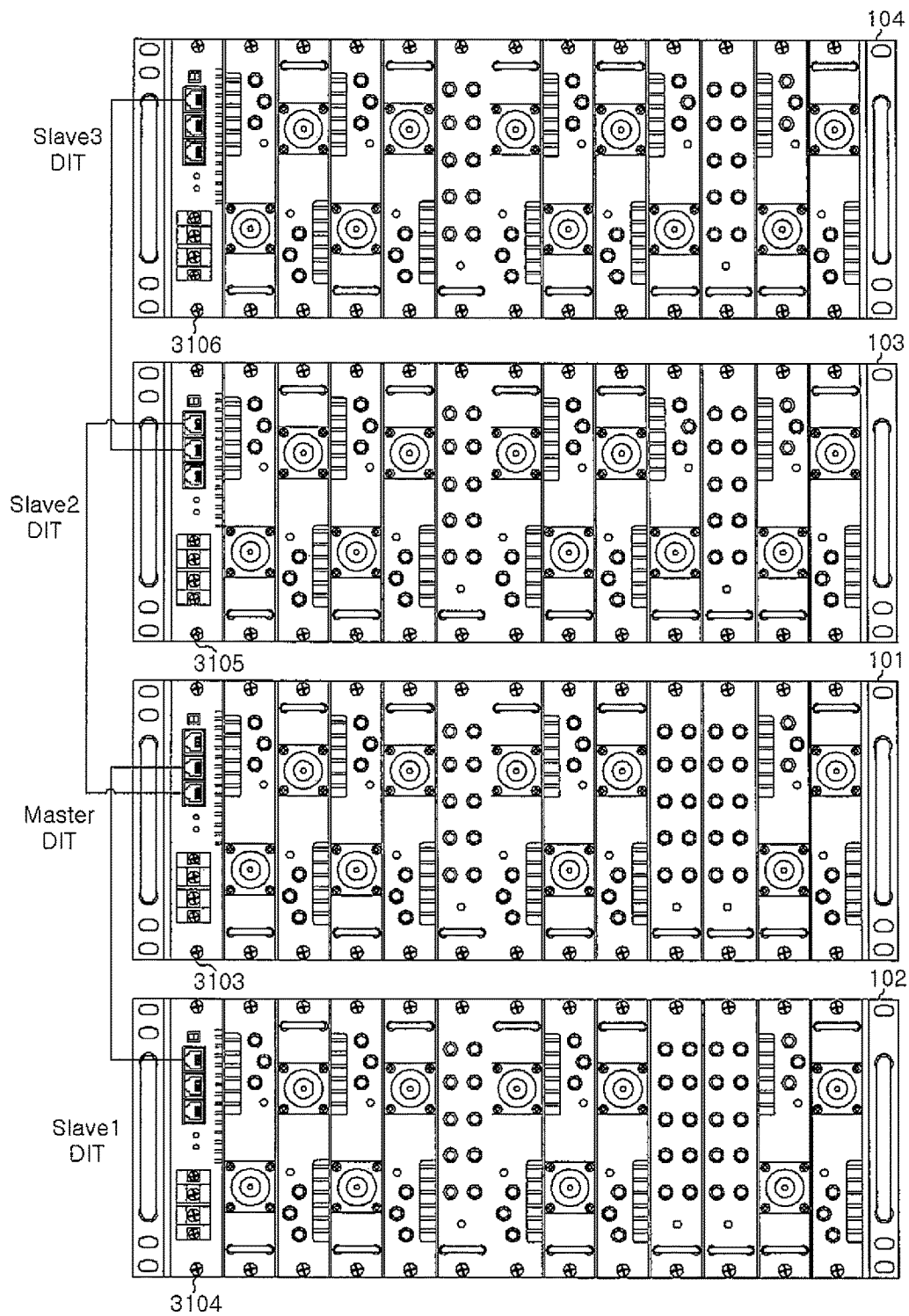
FIG. 13 is a diagram illustrating a variety of connection with other DITs being physically spaced according to an example embodiment.

As shown in FIG. 13, the DITs 101, 102, 103, and 104 may be connected to each other in a form of daisy chain. In some alternative embodiments, the DITs 101, 102, 103, and 104 may additionally or alternatively be connected to each other using other network topologies, such as a star network topology.

Although example embodiments of the present disclosure have been described above with reference to the accompanying drawings, it will be understood to those skilled in the art that the present disclosure may be implemented in various ways without changing the spirit or necessary features of the present disclosure. Therefore, the example embodiments should be regarded as illustrative rather than limiting in all aspects. In an example, each component which has been described as a unitary part can be implemented as distributed parts. Likewise, each component which has been described as distributed parts can also be implemented as a combined part.

The scope of the present disclosure is presented by the accompanying claims rather than the foregoing description. It should be understood that all changes or modifications derived from the definitions and scopes of the claims and their equivalents fall within the scope of the present disclosure.

What is claimed is:

1. A distributed antenna system (DAS) interface tray (DIT) comprising:
a plurality of per-carrier points of interface (POIs), each of the plurality of POIs configured to:
couple with a corresponding per-carrier base transceiver station (BTS);
receive a per-carrier downlink (DL) signal from the corresponding BTS;
filter the DL signal through a duplexer;
adjust the filtered DL signal based on a designated level;
output the filtered DL signal to a combiner;
receive an uplink (UL) signal from the combiner;
adjust the UL signal based on a designated gain; and
transmit the UL signal to the corresponding BTS;
the combiner configured to:
combine a plurality of DL signals received from the plurality of POIs into a combined DL signal;
transmit the combined DL signal to a distributed antenna system;
receive a UL signal from the distributed antenna system; and
distribute the UL signal to the plurality of POIs; and
a DIT management system (DMS) physically connected to other portions of the DIT and configured to monitor and control the plurality of POIs and the combiner.

2. The DIT of claim 1, wherein the DIT further comprises a fan unit (FU), the FU including a fan to control a temperature of the DIT, wherein the DMS is further configured to control the FU.

3. The DIT of claim 1, wherein each of the plurality of POIs comprises:
the duplexer connected to the corresponding BTS through a radio frequency (RF) line, and configured to separate a DL path and a UL path and filter a passive intermodulation (PIM) signal in a reverse direction of the DL signal;
a fixed attenuator configured to attenuate an input DL signal based on a designated amount of attenuation;
a DL variable attenuator in the DL path to adjust a first RF signal based on a designated gain;
a DL input detector in the DL path to detect a level of the DL signal input from the BTS and transmit the detected information to a POI controller (POIC);
a DL output detector in the DL path to detect a level of the DL signal output to the DAS and transmit the detected information to the POIC;
a UL variable attenuator in the UL path to adjust a second RF signal based on a designated gain;
an amplifier part in the UL path to amplify the UL signal; and
the POIC physically connected to other portions of the POI and configured to monitor and control a state of the POI, and report the state and installation information of the POI to the DMS of the DIT where the POIC is installed.

4. The DIT of claim 3, wherein each of the plurality of POIs further comprises a tone generator (TG) configured to verify a DL gain setting state of a POI with respect to the DL path, and function as a signal generator to verify a setting state and provide a gain setting convenience of the DAS which is an external device connected to the DIT.

5. The DIT of claim 4, wherein the TG comprises a phase locked loop (PLL) and a variable gain amplifier to enable a user to set a tone output, a tone frequency, and a tone holding time.

6. The DIT of claim 3, wherein each of the plurality of POIs further comprises a spectrum analyzing part (SAP) configured to enable a frequency domain spectrum waveform and a value to be verified through a graphical user interface (GUI) by a designated process and frequency conversion on the UL signal input from the DAS which is an external device connected to the DIT with respect to the UL path.

7. The DIT of claim 6, wherein the SAP is configured to input the UL signal into a frequency mixer, to convert the UL signal into an intermediate frequency (IF) through a frequency swept output of a phase locked loop (PLL), to filter the IF UL signal through a band pass filter having a designated bandwidth, and to detect a level of the IF UL signal using a spectrum detector, and when a user sets a desired frequency range of a spectrum through the GUI, a value detected by the detector changes as a frequency of the PLL is swept through a designated process, and the changed value is verified on a screen of the GUI using values and a graph with a frequency axis and a level axis.

8. The DIT of claim 3, wherein the DL variable attenuator and the UL variable attenuator comprise a digital attenuator and an analog attenuator.

9. The DIT of claim 1, wherein the combiner comprises:
a DL multi-way combiner configured to combine signals input through a plurality of input ports into a single line in a DL direction, and to output the combined signal on the single line in the DL direction to the DAS; and
a UL multi-way divider configured to divide the UL signal received from the DAS into multiple lines in a UL direction, and to transmit the divided UL signals to a plurality of output ports, the plurality of output ports connected to the plurality of POIs.

10. The DIT of claim 9, wherein the combiner further comprises a combiner controller (COMC) configured to perform a commissioning function to enable the combined DL signal to be output at a per-carrier ratio set by a user with respect to levels of signals input from per-carrier BTSs.

11. The DIT of claim 10, wherein one or more slave DITs each comprise a slave COMC and a slave DMS, and the COMC is configured to perform commissioning of the one or more slave COMCs through communication with the one or more slave DMSs in addition to commissioning of the DIT to which the COMC belongs through communication with the DMS.

12. The DIT of claim 1, wherein the DMS has installation information of the POIs and the COM, the DMS is configured to communicate with one or more slave DITs, each of the one or more slave DITs comprises a slave DMS, a slave COM, and a slave POI, and wherein the DMS is configured to manage and monitor the slave DMSs, slave COMs, and slave POIs.

13. The DIT of claim 12, wherein the DIT and the plurality of slave DITs are mutually connected using a daisy chain or star topology.

14. The DIT of claim 1 wherein the duplexer comprises a cavity duplexer.

15. The DIT of claim 1 wherein the duplexer comprises a duplexer with an excellent passive intermodulation (PIM) characteristic.

16. The DIT of claim 1 wherein each of the plurality of POIs is further configured to filter the UL signal through the duplexer.

17. The DIT of claim 16 wherein each of the plurality of POIs is configured to filter the UL signal through the duplexer before transmitting the UL signal to the corresponding BTS.

18. The DIT of claim 1 wherein each of the plurality of POIs is configured to adjust the filtered DL signal based on a designated level by applying the filtered DL signal to a fixed attenuator.

19. A distributed antenna system (DAS) interface tray (DIT) comprising:
a plurality of per-carrier points of interface (POIs), each of the plurality of POIs configured to:
couple with a corresponding per-carrier base transceiver station (BTS);
receive a per-carrier downlink (DL) signal from the corresponding BTS;
filter the DL signal through a duplexer;
adjust the filtered DL signal based on a designated level;
output the filtered DL signal to a combiner;
receive an uplink (UL) signal from the combiner;
adjust the UL signal based on a designated gain; and
transmit the UL signal to the corresponding BTS;
the combiner configured to:
combine a plurality of DL signals received from the plurality of POIs into a combined DL signal;
transmit the combined DL signal to a distributed antenna system;
receive a UL signal from the distributed antenna system; and
distribute the UL signal to the plurality of POIs; and
a DIT management system (DMS) configured to monitor and control the plurality of POIs and the combiner;
wherein each of the plurality of POIs comprises a tone generator (TG) configured to verify a DL gain setting state of a POI with respect to a DL path, and function as a signal generator to verify a setting state and provide a gain setting convenience of a DAS which is an external device connected to the DIT.

20. A distributed antenna system (DAS) interface tray (DIT) comprising:
a plurality of per-carrier points of interface (POIs), each of the plurality of POIs configured to:
couple with a corresponding per-carrier base transceiver station (BTS);
receive a per-carrier downlink (DL) signal from the corresponding BTS;
filter the DL signal through a duplexer;
adjust the filtered DL signal based on a designated level;
output the filtered DL signal to a combiner;
receive an uplink (UL) signal from the combiner;
adjust the UL signal based on a designated gain; and
transmit the UL signal to the corresponding BTS;
the combiner configured to:
combine a plurality of DL signals received from the plurality of POIs into a combined DL signal;
transmit the combined DL signal to a distributed antenna system;
receive a UL signal from the distributed antenna system; and
distribute the UL signal to the plurality of POIs; and
a DIT management system (DMS) configured to monitor and control the plurality of POIs and the combiner;
wherein each of the plurality of POIs comprises a spectrum analyzing part (SAP) configured to enable a frequency domain spectrum waveform and a value to be verified through a graphical user interface (GUI) by a designated process and frequency conversion on a UL signal input from a DAS which is an external device connected to the DIT with respect to the UL path, the SAP being further configured to input the UL signal into a frequency mixer, to convert the UL signal into an intermediate frequency (IF) through a frequency swept output of a phase locked loop (PLL), to filter the IF UL signal through a band pass filter having a designated bandwidth, and to detect a level of the IF UL signal using a spectrum detector, and when a user sets a desired frequency range of a spectrum through the GUI, a value detected by the detector changes as a frequency of the PLL is swept through a designated process, and the changed value is verified on a screen of the GUI using values and a graph with a frequency axis and a level axis.

* * * * *